(12) United States Patent
Son

(10) Patent No.: US 8,426,887 B2
(45) Date of Patent: Apr. 23, 2013

(54) LIGHT EMITTING DEVICE AND LIGHT EMITTING DEVICE PACKAGE

(75) Inventor: Hyo Kun Son, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/028,449

(22) Filed: Feb. 16, 2011

(65) Prior Publication Data
US 2011/0198564 A1 Aug. 18, 2011

(30) Foreign Application Priority Data
Feb. 18, 2010 (KR) .................. 10-2010-0014437

(51) Int. Cl.
*H01L 33/00* (2010.01)
(52) U.S. Cl.
USPC 257/103; 257/95; 257/E33.006; 257/E33.025; 257/E33.034; 257/E33.028
(58) Field of Classification Search .................. 257/103, 257/95, E33.006, E33.025, E33.034, E33.028
See application file for complete search history.

(56) References Cited

U.S. PATENT DOCUMENTS

| 5,814,839 A | 9/1998 | Hosoba | 257/96 |
| 2008/0054285 A1* | 3/2008 | Park | 257/98 |

FOREIGN PATENT DOCUMENTS

| JP | 03-240099 B2 | 12/2001 |
| KR | 10-2001-009602 A | 2/2001 |
| KR | 10-2004-0067705 A | 7/2004 |
| KR | 10-0809229 B1 | 2/2008 |

OTHER PUBLICATIONS

English Machine Translation for JP3240099.*

* cited by examiner

*Primary Examiner* — Julio J Maldonado
*Assistant Examiner* — Amar Movva
(74) *Attorney, Agent, or Firm* — KED & Associates LLP

(57) ABSTRACT

Provided is a light emitting device. In one embodiment, the light emitting device includes: a first conductive type semiconductor layer including a plurality of grooves; an active layer formed on a upper surface of the first conductive type semiconductor layer and along the grooves; an anti-current leakage layer having a flat upper surface on the active layer; and a second conductive type semiconductor layer on the anti-current leakage layer.

10 Claims, 9 Drawing Sheets

LIGHT EMITTING DEVICE AND LIGHT EMITTING DEVICE PACKAGE

CROSS-REFERENCE TO RELATED APPLICATIONS

The present application claims priority under 35 U.S.C. §119(a) of Korean Patent Application No. 10-2010-0014437 filed on Feb. 18, 2010, which is hereby incorporated by reference in its entirety.

BACKGROUND

Embodiments relate to a light emitting device and a light emitting device package.

A light emitting diode (LED) is a semiconductor light emitting device converting current to light. In recent years, as the luminance of the LED increases gradually, the use of the LED as a light source for a display, a light source for a vehicle, and a light source for a lighting system is increasing. An LED emitting white light and having superior efficiency may be implemented by using a fluorescent material or combining individual LEDs that emit three primary colors.

The luminance of the LED depends on various conditions, such as the structure of an active layer, a light extracting structure capable of effectively extracting light to an outside, semiconductor material used in the LED, a chip size, and the type of a molding member enclosing the LED.

SUMMARY

Embodiments provide a light emitting device and a method of manufacturing the same, and light emitting device package having a novel structure.

Embodiments also provide a light emitting device and a method of manufacturing the same, and light emitting device package based a nitride semiconductor material having a superior crystalline property.

Embodiments also provide a light emitting device and a method of manufacturing the same, and light emitting device package being capable of reducing a leakage current.

In one embodiment, the light emitting device includes: a first conductive type semiconductor layer including a plurality of grooves; an active layer formed on a upper surface of the first conductive type semiconductor layer and along the grooves; an anti-current leakage layer having a flat upper surface on the active layer; and a second conductive type semiconductor layer on the anti-current leakage layer.

In another embodiment, a light emitting device includes: a substrate; a groove forming layer formed on the substrate; a first conductive type semiconductor layer formed on the groove forming layer, having a thickness in a range of about 1 μm to about 5 μm, and doped with P type dopants; an active layer formed on the first conductive type semiconductor layer; and a second conductive type semiconductor layer formed on the active layer and doped with an N type dopants.

In a further embodiment, a light emitting device includes: a substrate; a first conductive type semiconductor layer formed on the substrate, having a thickness in a range of about 1 μm to about 5 μm, and doped with P type dopants; an active layer formed on the first conductive type semiconductor layer; an anti-current leakage layer having a flat upper surface on the active layer, the anti-current leakage layer having a bandgap greater than a bandgap of the active layer; and a second conductive type semiconductor layer formed on the active layer and doped with an N type dopants.

In a still another embodiment, a method of manufacturing a light emitting device includes: forming a groove forming layer including a plurality of grooves on a substrate; forming a first conductive type semiconductor layer on the groove forming layer in such a manner that the shapes of the grooves are maintained; forming an active layer on the first conductive type semiconductor layer in such a manner that shapes of the grooves are maintained; forming an anti-current leakage layer having a flat upper surface on the active layer; and forming a second conductive type semiconductor layer on the an anti-current leakage layer.

In a still another embodiment, a light emitting device package includes: a package body part; first and second lead electrodes installed in the package body; a light emitting device installed in the package body and electrically connected to the first and second lead electrodes; and a molding member surrounding the light emitting device. The light emitting device includes a first conductive type semiconductor layer including a plurality of grooves, an active layer formed on a upper surface of the first conductive type semiconductor layer and along the grooves, an anti-current leakage layer formed on the active layer and having a flat upper surface, and a second conductive type semiconductor layer on the anti-current leakage layer.

DETAILED DESCRIPTION OF THE EMBODIMENTS

In the following description, it will be understood that when a layer (or film) is referred to as being "on" another layer or substrate, it can be directly on the other layer or substrate, or intervening layers may also be present. Further, it will be understood that when a layer is referred to as being "under" another layer, it can be directly under the other layer, and one or more intervening layers may also be present. In addition, word "on," or "under," are will be described based on the accompanying drawings.

In the figures, the dimensions of layers and regions are exaggerated for clarity of illustration. In addition, the dimension of each part does not reflect an actual size.

Hereinafter, a light emitting device, a method of manufacturing the same, a light emitting device package, and a lighting system according to embodiments will be described with reference to the accompanying drawings.

Figure 1:
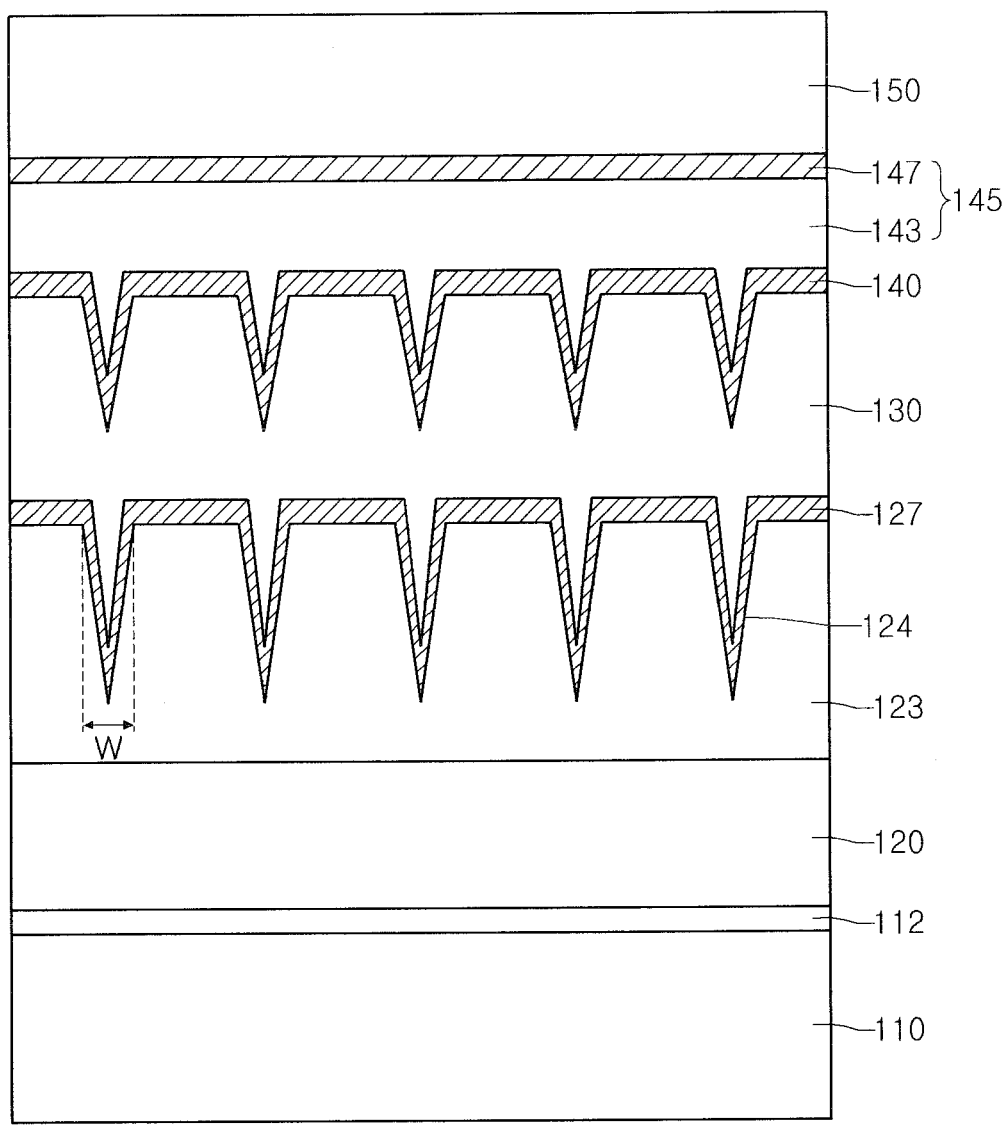
FIG. 1 is a cross-sectional view of a light emitting device according to an embodiment.

FIG. 1 is a cross-sectional view of a light emitting device 100 according to an embodiment.

Referring to FIG. 1, the light emitting device 100 according to the embodiment includes a substrate 110, a buffer layer 112 on the substrate 110, an undoped semiconductor layer 120 on the buffer layer 112, a groove forming layer 123 on the undoped semiconductor layer 120, a supperlattice structure layer 127 on the groove forming layer 123, a first conductive type semiconductor layer 130 on the supperlattice structure layer 127, an active layer 140 on the first conductive type semiconductor layer 130, an anti-current leakage layer 145 on the active layer 140, and a second conductive type semiconductor layer 150 on the anti-current leakage layer 145.

Electrons (or holes) injected through the first conductive type semiconductor layer 130 may be recombined with holes (or electrons) injected through the second conductive type semiconductor layer 150 at the active layer 140, so that the active layer 140 emits the light. Thus, the first conductive type semiconductor layer 130, the active layer 140, and the second conductive type semiconductor layer 150 may form a light emitting structure for emitting light.

The substrate 110 may be made of at least one of, for example, sapphire ($Al_2O_3$), SiC, GaAs, GaN, ZnO, Si, GaP, InP, and Ge, but is not limited thereto.

Although it is not shown, the substrate 110 may be formed of a patterned sapphire substrate (PSS) where patterns are formed, or an upper surface of the substrate 110 may be inclined with a main surface. Thus, the embodiment is not limited thereto.

The substrate 110 may be prepared by being cleansed through a thermal cleansing with a temperature of 1070□ in a chamber.

A plurality of layers formed on the substrate 110 may include a nitride semiconductor material. For example, the nitride semiconductor material may have the compositional formula of $In_xAl_yGa_{1-x-y}N$ ($0 \leq x \leq 1$, $0 \leq y \leq 1$, $0 \leq x+y \leq 1$).

The plurality of layers having the nitride semiconductor material may be formed, for example, using a MOCVD (Metal Organic Chemical Vapor Deposition) method, a CVD (Chemical Vapor Deposition) method, a PECVD (Plasma-Enhanced Chemical Vapor Deposition) method, an MBE (Molecular Beam Epitaxy) method, an HVPE (Hydride Vapor Phase Epitaxy) method, etc., but is not limited thereto.

The buffer layer 112 may be formed on the substrate 110. The buffer layer 112 may be formed to relieve lattice mismatch due to a lattice constant difference between the substrate 110 and the first conductive type semiconductor layer 130.

The buffer layer 112 may include semiconductor materials having the compositional formula of $In_xAl_yGa_{1-x-y}N$ ($0 \leq x \leq 1$, $0 \leq y \leq 1$, $0 \leq x+y \leq 1$), for example, AlN, GaN, etc.

The buffer layer 112 may be grown at a temperature ranging from about 400° C. to about 1000° C., particularly, at a temperature of about 400° C. to about 600° C.

The undoped semiconductor layer 120 may be formed on the buffer layer 112. Since the undoped semiconductor layer 120 is not doped with a conductive dopant, the undoped semiconductor layer 120 is significantly lower in electric conductivity than the first and second semiconductor layers 130 and 150. For example, the undoped semiconductor layer 120 may include semiconductor materials having the compositional formula of $In_xAl_yGa_{1-x-y}N$ ($0 \leq x \leq 1$, $0 \leq y \leq 1$, $0 \leq x+y \leq 1$). The undoped semiconductor layer 120 may be grown at a temperature ranging from about 1000° C. to about 1100° C.

The undoped semiconductor layer 120 can relieve lattice mismatch due to a lattice constant difference between the substrate 110 and the first conductive type semiconductor layer 130. Also, the undoped semiconductor layer 120 can enhance the crystalline property of the layers formed on the undoped semiconductor layer 120.

The groove forming layer 123 including groves 124 may be formed on the undoped semiconductor layer 120. The planar area of the groove 124 gradually dereases as it goes toward the inside of the groove forming layer 123. For example, the groove 124 may have a cross section of a V shape (V-pit).

The groove forming layer 123 may include the same material as the undoped semiconductor layer 120. For example, the groove forming layer 123 may include semiconductor materials having the compositional formula of $In_xAl_yGa_{1-x-y}N$ ($0 \leq x \leq 1$, $0 \leq y \leq 1$, $0 \leq x+y \leq 1$), preferably, GaN.

The groove forming layer 123 may be grown at a temperature ranging from about 600□ to about 1000□, which is relatively lower than in the grown temperature of the undoped semiconductor layer 120. Accordingly, during the groove forming layer 123 is grown, the agglomeration generates, and then the groove forming layer 123 has a plurality of the grooves 124.

The main reason of the agglomeration may be a lattice constant difference between the substrate 110 and the groove forming layer 123. That is, because the undoped semiconductor layer 120 is grown at the relatively high temperature, the undoped semiconductor layer 120 may be relatively flat. However, because the groove forming layer 123 is grown at the relatively low temperature, the lattice constant difference between the substrate 110 and the groove forming layer 123 affects to the growth of the groove forming layer 123. Thus, the groove forming layer 123 may include the plurality of the grooves 124.

If the groove forming layer 123 is formed using a MOCVD (Metal Organic Chemical Vapor Deposition) method, the groove forming layer 123 may be formed by supplying at least one gas of a trimethylgallium gas (TMGa), an ammonia gas ($NH_3$), a nitrogen gas ($N_2$) and a hydrogen gas ($H_2$) in a chamber with a temperature of about 600° C. to about 1000° C.

The groove forming layer 123 may have a thickness of about 0.5 μm to 5 μm.

Figure 2:
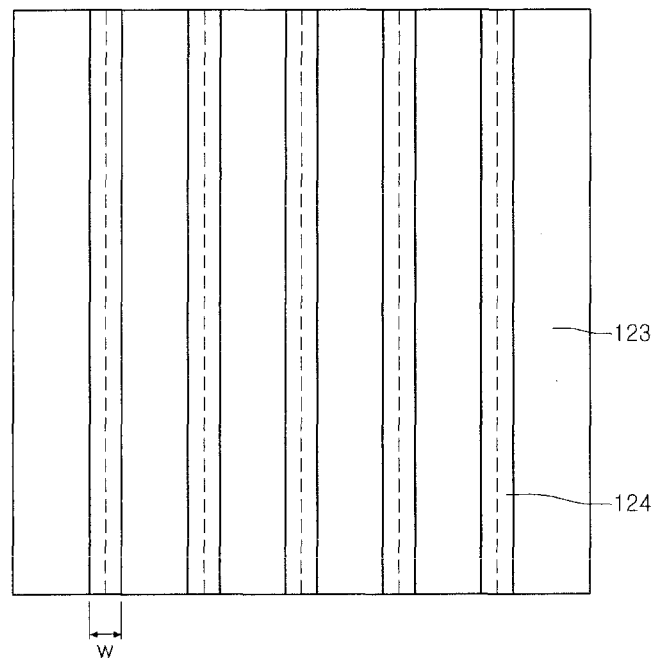
FIG. 2 illustrates a plan view of a groove forming layer and a perspective view of grooves formed at the groove forming layer in the light emitting device of FIG. 1.

As shown in FIG. 2, the groove 124 has the V-shaped cross section and elongated in one direction in the plan view.

Figure 3:
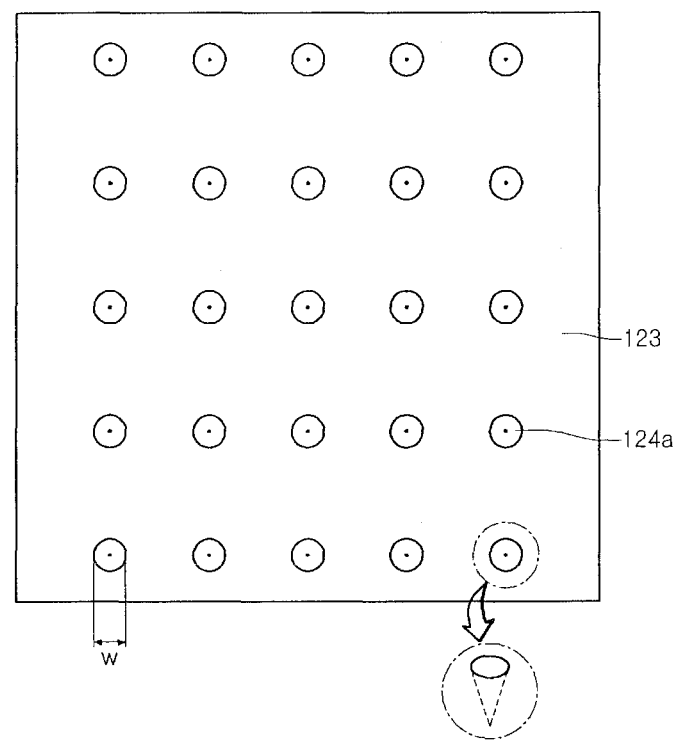
FIG. 3 illustrates a plan view of a groove forming layer and a perspective view of grooves formed at the groove forming layer according to a modified embodiment.
Figure 4:
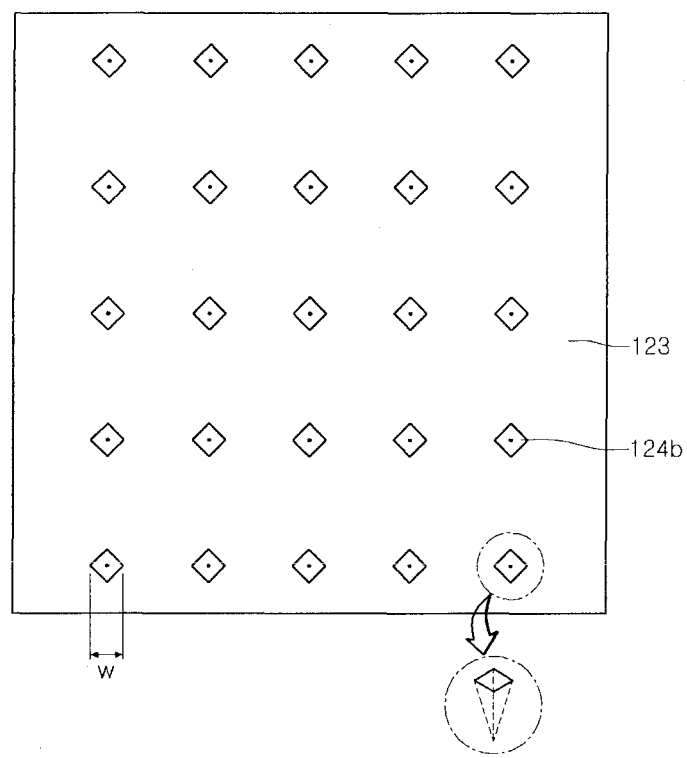
FIG. 4 illustrates a plan view of a groove forming layer and a perspective view of grooves formed at the groove forming layer according to another modified embodiment.

In a modified embodiment shown in FIG. 3, the groove 124a has a conical shape. In another modified embodiment shown in FIG. F, the groove 124b has a polygonal pyramid shape. That is, the planar area of the groove 124 gradually decreases as it goes toward the inside of the groove forming layer 123. However, the shape of the groove is not limited thereto.

In the cross section of the groove 124, a upper width (or diameter) of the groove 124 may be about 0.5 μm to about 1.5 μm, and a depth of the groove 124 may be about 0.3 μm to about 0.7 μm, but is not limited thereto.

Meanwhile, although the groove forming layer 123 has the groove 124 due to the agglomeration at the surface, the groove forming layer 123 allows the layers formed on the groove forming layer 123 (for example, the first conductive type semiconductor layer 130, the active layer 140, and the second conductive type semiconductor layer 130) to have the superior crystalline property. That is, due to the defects or the dislocations induced by the lattice constant difference with the substrate 110, the groove 124 may be formed at the groove forming layer 123. On the contrary to this, the layers formed on the groove forming layer 123 can have the superior crystalline property by the agglomeration. Thus, by forming the nitride semiconductor layers on the groove forming layer 123, the brightness of the light emitting device 100 can be increased.

The superlattice structure layer 127 may be formed on the groove forming layer 123. The superlattice structure layer 127 may include a structure that a plurality of layers different materials are alternately stacked.

For example, in the supperlattice structure layer 127, pairs of an InGaN layer and a GaN layer are repeatedly stacked by about 15 times to about 25 times. Here, each of the InGaN layer and the GaN layer may have a thickness of about 5 Å to about 25 Å.

If the supperlattice structure layer 127 is formed using a MOCVD (Metal Organic Chemical Vapor Deposition) method, the supper lattice layer 127 may be formed by supplying at least one gas of a trimethylgallium gas (TMGa), an ammonia gas ($NH_3$), a nitrogen gas ($N_2$), and a hydrogen gas ($H_2$) in a chamber.

The supperlattice structure layer 127 may control a size and a shape of the groove 124. That is, according to an amount of indium included in the supperlattice structure layer 127 and a growth temperature of the supperlattice structure layer 127, the width (or diameter) (w) and the depth of the groove 124 can be controlled.

The supperlattice structure layer 127 may have a uniform thickness, and the upper and lower surfaces of the supperlattice structure layer 127 may be formed along the grooves 124. That is, at the portion where the grooves 124 are formed, the upper and lower surfaces have corresponding grooves by the grooves 124.

The first conductive type semiconductor layer 130 may be formed on the supperlattice structure layer 127. The first conductive type semiconductor layer 130 may include a p type semiconductor layer. The p type semiconductor layer may include semiconductor materials having the compositional formula of $In_xAl_yGa_{1-x-y}N$ ($0 \leq x \leq 1$, $0 \leq y \leq 1$, $0 \leq x+y \leq 1$), such as InAlGaN, GaN, AlGaN, InGaN, AlN, and InN. In addition, the p type semiconductor layer may be doped with p type dopant, such as Zn, Mg, Ca, Sr, Ba, by a dopant concentration of $10^{20}$ cm$^{-3}$ to $9 \times 10^{21}$ cm$^{-3}$.

Conventionally, since the p type semiconductor layer is formed on an active layer, the p type semiconductor layer is grown with a thickness of about 1000□ to about 2000□ at a relatively low temperature of about 900° C. to about 1000□ in order to prevent a damage of the active layer.

However, in the embodiment, the first conductive type semiconductor layer 130 of the p type semiconductor layer is formed before the active layer 140. Thus, the first conductive type semiconductor layer 130 can be grown at a relatively high temperature of about 1100° C. to about 1150° C., and can have a thickness of about 1 µm to about 5 µm. Thus, the crystalline property of the first conductive type semiconductor layer 130 can be increased, and thus the light emitting efficiency of the light emitting device 100 can be enhanced.

If the first conductive type semiconductor layer 130 is formed using a MOCVD (Metal Organic Chemical Vapor Deposition) method, the first conductive type semiconductor layer 130 may be formed by supplying at least one gas of a trimethylgallium gas (TMGa), an ammonia gas ($NH_3$), a nitrogen gas ($N_2$), and a hydrogen gas ($H_2$) and a p type dopant gas including a p type dopant such as Zn and Mg in a chamber. But, the method of forming the first conductive type semiconductor layer 130 is not limited thereto.

In this case, in order to increase the doping efficiency at a relatively high temperature such as the growth temperature of the first conductive type semiconductor layer 130 (about 1100° C. to about 1150° C.), the p type dopant doped into the first conductive type semiconductor layer 130 may include Zn.

Meanwhile, the gallium (Ga) has a characteristic that is flatly grown. Thus, by maintaining an amount of the TMGa gas by about 1 sscm (standard cubic centimeter per minute) to 2 sscm (about ⅒ of the amount of the TMGa gas in the conventional art) supplied in the chamber when the first conductive type semiconductor layer 130 is grown, the first conductive type semiconductor layer 130 has grooves corresponding to the grooves 124 formed on the groove forming layer 123.

Also, by introducing the TMGa gas slowly, Zn or Mg used as the conductive dopant can be effectively activated at the growth process.

The first conductive type semiconductor layer 130 may have a uniform thickness, and the upper and lower surfaces of the first conductive type semiconductore layer 130 may be formed along the grooves 124. Thus, the upper surface of the first conductive type semiconductore layer 130 is provided with grooves. The grooves of the first conductive type semiconductore layer 130 have shapes corresponding to the grooves 124, and the planar area of the groove of the first conductive type semiconductore layer 130 gradually dereases as it goes toward the inside of the first conductive type semiconductor layer 130.

The active layer 140 may be formed on the first conductive type semiconductore layer 130.

The active layer 140 may include semiconductor materials having the compositional formula of $In_xAl_yGa_{1-x-y}N$ ($0 \leq x \leq 1$, $0 \leq y \leq 1$, $0 \leq x+y \leq 1$). The active layer 140 may have at least one of a quantum wire structure, a quantum dot structure, a single quantum well structure, or a multiple quantum well (MQW) structure.

In the case that the active layer 140 has the multiple quantum well (MQW), the active layer 140 may be formed by alternatively stacking a plurality of well layers and a plurality of barrier layers. For example, the plurality of well layers may have the compositional formula of $In_xGa_{1-x}N$ ($0.15 \leq x1$), and the plurality of barrier layers may have the compositional formula of $In_yGa_{1-y}N$ ($0 \leq y \leq 0.03$).

If the active layer 140 is formed using a MOCVD (Metal Organic Chemical Vapor Deposition) method, the active layer 140 may be formed by supplying at least one gas of a trimethylgallium gas (TMGa), an ammonia gas ($NH_3$), a nitrogen gas ($N_2$), and a hydrogen gas ($H_2$) in a chamber. Then, the active layer 140 has the multiple quantum well having InGaN/GaN structure. But, the method of forming the active layer 140 is not limited thereto.

In the embodiment, the growth speed of the well layers may be about 0.5 Å/min to about 1 Å/min, and the growth speed of the barrier layers may be about 5 Å/min to about 110 Å/min.

As such, since the growth speed of the well layers is smaller than the growth speed of the barrier layers, an amount of the indium contained in the well layers can be controlled in detail. Thus, the surplus indium can be minimized. The indium has a characteristic that is grown with the agglomeration. Thus, by reducing the amount of the indium, the agglomeration of the surface of the active layer 140 can be minimized. Thus, the light emitting efficiency of the light emitting device 100 can be enhanced.

The active layer 140 may have a uniform thickness, and the upper and lower surfaces of the active layer 140 may be formed along the grooves 124. Thus, the upper surface of the active layer 140 is provided with grooves.

The anti-current leakage layer 145 may be formed on the active layer.

The anti-current leakage layer 145 has a relatively high band gap energy and resistance, thereby spreading a current to an entire region of the light emitting device 100. In addition, the anti-current leakage layer 145 is grown to fill an area sunk by the grooves 124, and thus has a flat upper surface. Thus, the anti-current leakage layer 145 contributes so that the light emitting device 100 can have a flat surface. Accordingly, the current leakage can be minimized.

The anti-current leakage layer 145 includes at least one of a first anti-current leakage layer 143 and a second anti-current leakage layer 147. Here, the first anti-current leakage layer 143 fills the area sunk by the grooves 124, and thus has a flat upper surface. The second anti-current leakage layer 147 has a flat upper surface and a flat lower surface.

The first anti-current leakage layer 143 may include semiconductor materials having the compositional formula of $In_xAl_yGa_{1-x-y}N$ ($0 \leq x \leq 0.03$, $0 < y < 1$, $0 < x+y < 1$). Also, an n dopant such as Si is doped with at least part of the first anti-current leakage layer 143, and thus the at least part may include an n type semiconductor layer.

The first anti-current leakage layer 143 may have a thickness of about 0.3 μm to about 0.7 μm. And, the first anti-current leakage layer 143 may be grown at about 900° C. to about 1000° C.

The second anti-current leakage layer 147 may have a supperlattice structure (SLS) that AlGaN and GaN layers doped with n dopant are repeatedly stacked by several times.

For example, each of the AlGaN layer and the GaN layer may have a thickness of about 20 Å to about 30 Å. In the second anti-current leakage layer 147, a pair of an AlGaN layer and a GaN layer is repeatedly stacked by about 10 times. The second anti-current leakage layer 147 may be grown at a temperature of about 1000° C. to about 1100° C.

The anti-current leakage layer 145 include aluminum (Al), and thus has a relatively high band gap energy and resistance. By the difference in the band gap energy and the resistance between the active layer 140 and the anti-current leakage layer 145, the current can be effectively spreaded to the light emitting device 100.

The second conductive type semiconductor layer 150 may be formed on the anti-current leakage layer 145.

The second conductive type semiconductor layer 150 may include an n type semiconductor layer. The n type semiconductor layer may include semiconductor materials having the compositional formula of $In_xAl_yGa_{1-x-y}N$ ($0 \leq x \leq 1$, $0 \leq y \leq 1$, $0 \leq x+y \leq 1$), such as InAlGaN, GaN, AlGaN, InGaN, AlN, and InN. In addition, the p type semiconductor layer may be doped with p type dopant, such as Si, Ge, Sn, by a dopant concentration of $5 \times 10^{18}$ cm$^{-3}$ to $3 \times 10^{19}$ cm$^{-3}$.

If the second conductive type semiconductor layer 150 is formed using a MOCVD (Metal Organic Chemical Vapor Deposition) method, the second conductive type semiconductor layer 150 may be formed by supplying at least one gas of a trimethylgallium gas (TMGa), an ammonia gas ($NH_3$), a nitrogen gas ($N_2$), and a hydrogen gas ($H_2$) and an n type dopant gas including an n type dopant such as Si in a chamber. But, the method of forming the second conductive type semiconductor layer 150 is not limited thereto.

The second conductive type semiconductor layer 150 may be grown at a temperature ranging from about 1000° C. to about 1100° C. Thus, the second conductive type semiconductor layer 150 may have a thickness of about 1 μm to about 1.5 μm in order to prevent a damage of the active layer 140, but is not limited thereto.

Since the second conductive type semiconductor layer 150 include the n type semiconductor layer, a contact layer (not shown) that is easily ohmic-contact with the n type semiconductor layer can be easily formed on the second conductive type semiconductor layer 150.

Figure 5:
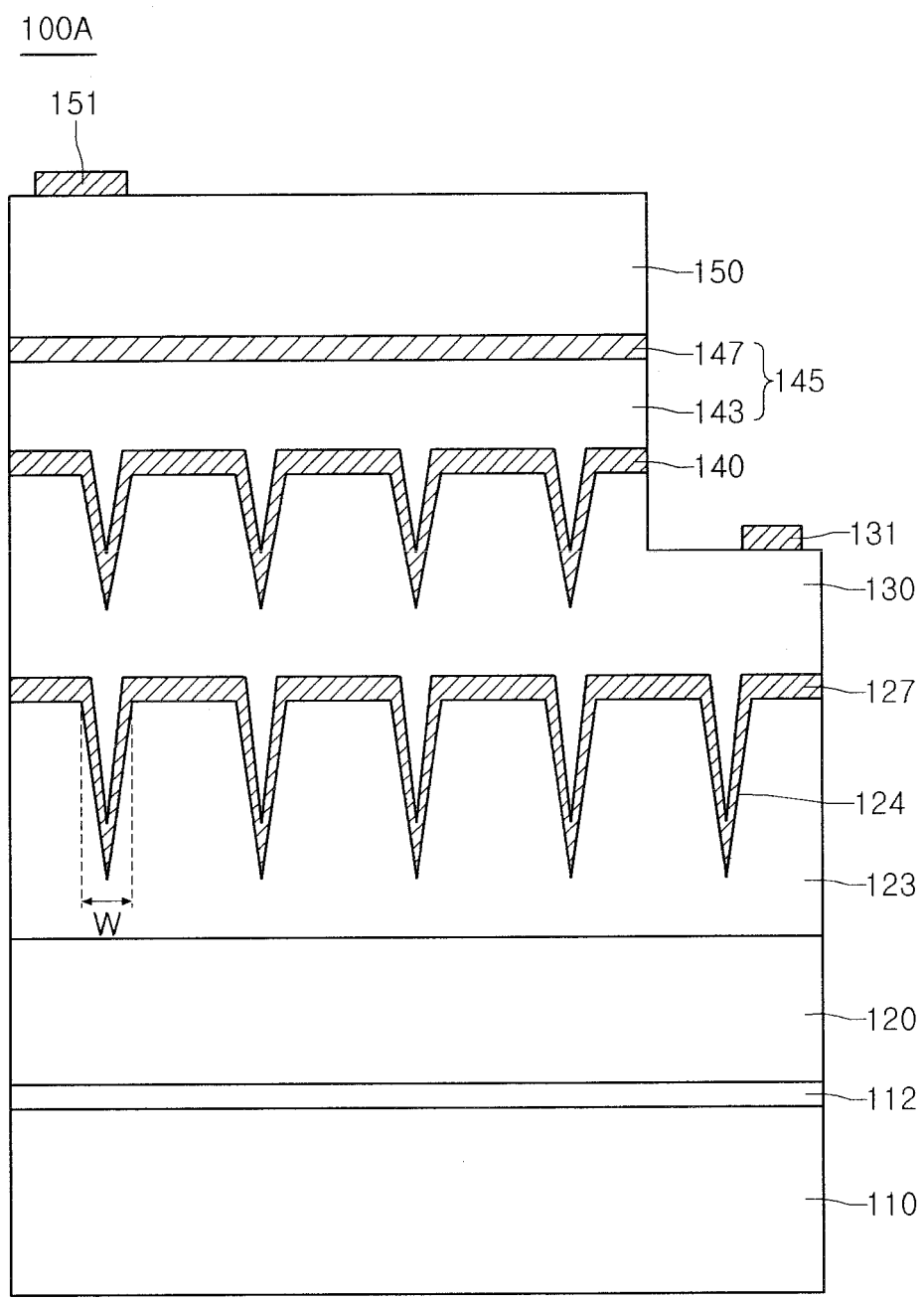
FIG. 5 is a cross-sectional view of a light emitting device with a lateral electrode structure including a light emitting device of FIG. 1.

FIG. 5 is a cross-sectional view of a light emitting device 100A with a lateral electrode structure including a light emitting device of FIG. 1.

Referring to FIG. 5, the light emitting device 100A with the lateral electrode structure includes a substrate 110, a buffer layer 112 on the substrate 110, an undoped semiconductor layer 120 on the buffer layer 112, a groove forming layer 123 on the undoped semiconductor layer 120, a supperlattice structure layer 127 on the groove forming layer 123, a first conductive type semiconductor layer 130 on the supperlattice structure layer 127, an active layer 140 on the first conductive type semiconductor layer 130, an anti-current leakage layer 145 on the active layer 140, a second conductive type semiconductor layer 150 on the anti-current leakage layer 145, a first electrode 131 on the first conductive type semiconductor layer 130, and a second electrode 151 on the second conductive type semiconductor layer 150.

That is, in order to provide the light emitting device 100A, a mesa-etching process may be performed on the light emitting device 100 for exposing the first conductive type semiconductor layer 130, and the first electrode 131 is formed on the exposed portion of the first conductive type semiconductor layer 130. Also, the second electrode 151 is formed on on the second conductive type semiconductor layer 150.

The first and second electrodes 131 and 151 laterally located are connected to the outside power supply, and thus the power is applied to the light emitting device 100A with the lateral electrode structure.

Meanwhile, contact layers (not shown) for an ohmic contact may be formed between the first electrode 131 and the first conductive type semiconductor layer 130 and between the second electrode 151 and the second conductive type semiconductor layer 150.

The contact layer may be a transparent contact layer or a reflective layer.

The transparent contact layer may include ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, Ni/IrOx/Au/ITO, ZnO, etc.

The reflective contact layer may include a metal having a high reflection efficiency. For example, the reflective layer 160 may include at least one of Ag, Al, Pt, Cu, or an alloy thereof, but is not limited thereto.

Figure 6:
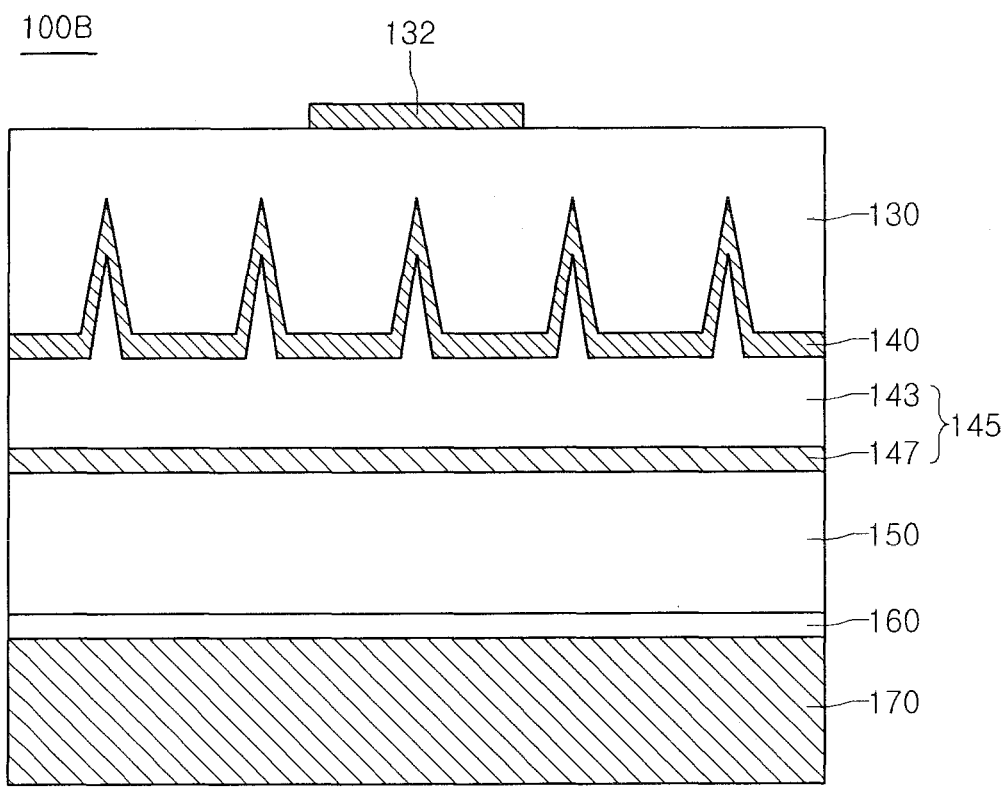
FIG. 6 is a cross-sectional view of a light emitting device with a vertical electrode structure including a light emitting device of FIG. 1.

FIG. 6 is a cross-sectional view of a light emitting device 100B with a vertical electrode structure including a light emitting device of FIG. 1.

Referring to FIG. 6, the light emitting device 100B with the vertical electrode structure includes a first conductive type semiconductor layer 130, an active layer 140 under the first conductive type semiconductor layer 130, an anti-current leakage layer 145 under the active layer 140, a second conductive type semiconductor layer 150 under the anti-current leakage layer 145, a reflective layer 160 under the second conductive type semiconductor layer 150, a conductive support member 170 under the reflective layer 160, and a third electrode 132.

That is, in order to provide the light emitting device 100B, the substrate (not shown) may be removed and the third electrode 132 may be formed after the conductive support member 170 may be formed on the light emitting device 100.

The conductive support member 170 and the third electrode 132 vertically located are connected to the outside power supply, and thus the power is applied to the light emitting device 100B with the vertical electrode structure.

The conductive support member 170 may include at least one selected from the group consisting of Ti, Cr, Ni, Al, Pt, Au, W, Cu, Mo and a semiconductor substrate doped with a dopant.

The reflective layer 160 may be made of metal having a high reflection efficiency. For example, the reflective layer 160 may include at least one of Ag, Al, Pt, Cu, or an alloy thereof.

The substrate (not shown) may be removed by a laser lift off (LLO) method and/or an etching method. After the removing the substrate (not shown), the etching for polishing a surface of the first conductive type semiconductor layer 130 may be performed.

Hereinafter, light emitting devices according to modified embodiments will be described. The detailed description to the contents similar to or the same as in the above will be omitted.

Figure 7:
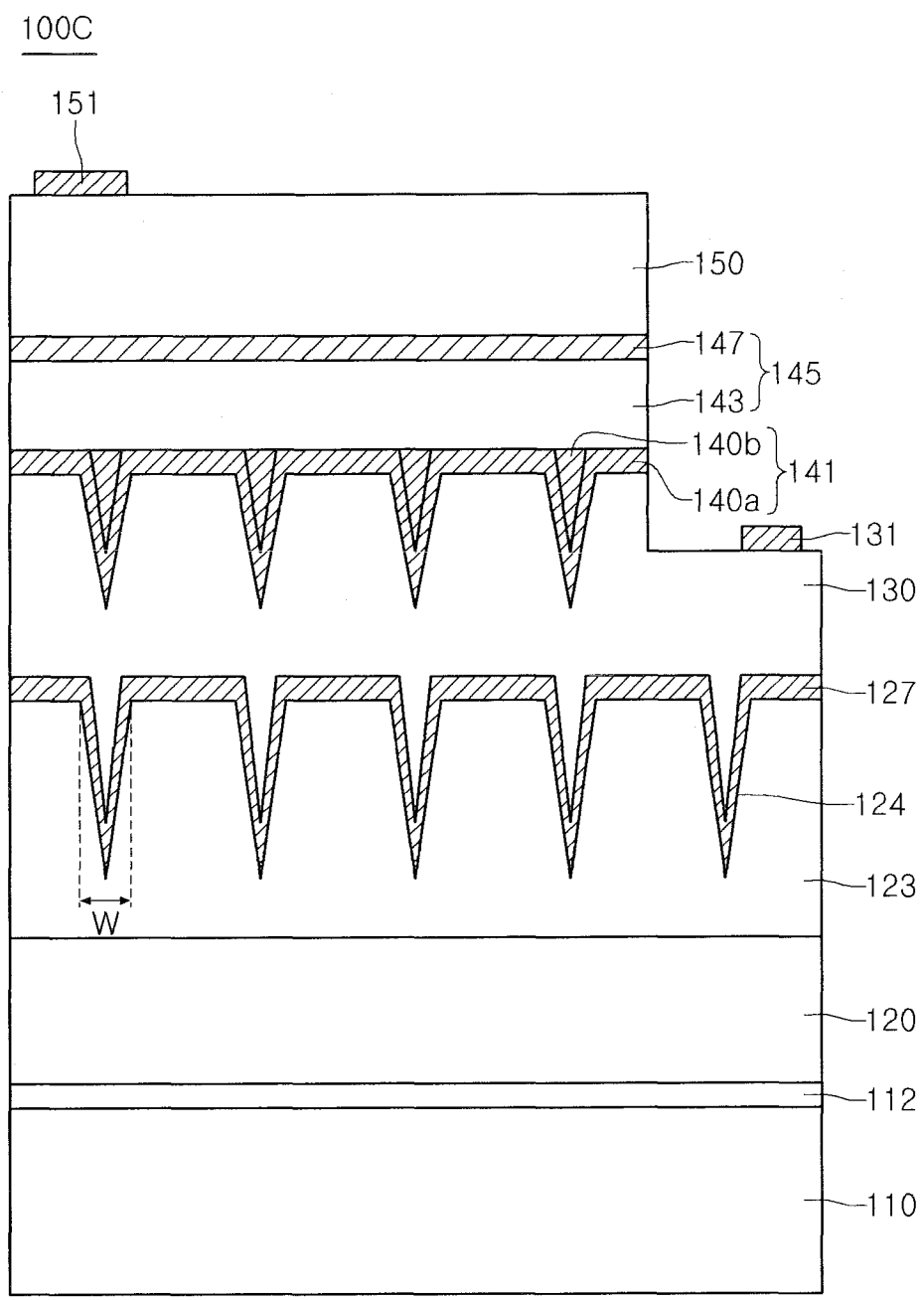
FIG. 7 is a cross-sectional view of a light emitting device according to a modified embodiment.

FIG. 7 is a cross-sectional view of a light emitting device according to a modified embodiment.

Referring to FIG. 7, in the light emitting device 100C of the present modified embodiment, an upper surface of the active layer 141 is flat. That is, the active layer 141 includes a first layer 140a having a uniform thickness along the groove formed on the first conductive type semiconductor layer 130, and a second layer 140b filling the inside of the groove. The first and second layers 140a and 140b may include semiconductor materials having the compositional formula of $In_xAl_yGa_{1-x-y}$ ($0 \leq x \leq 1$, $0 \leq y \leq 1$, $0 \leq x+y \leq 1$).

Since the active layer 141 has the flat upper surface, the electrical property and the reliability of the light emitting device 100C can be enhanced.

The light emitting device with the lateral electrode structure is provided as an example in FIG. 7. However, the active layer 141 may be applied to the light emitting device with the vertical electrode structure.

Figure 8:
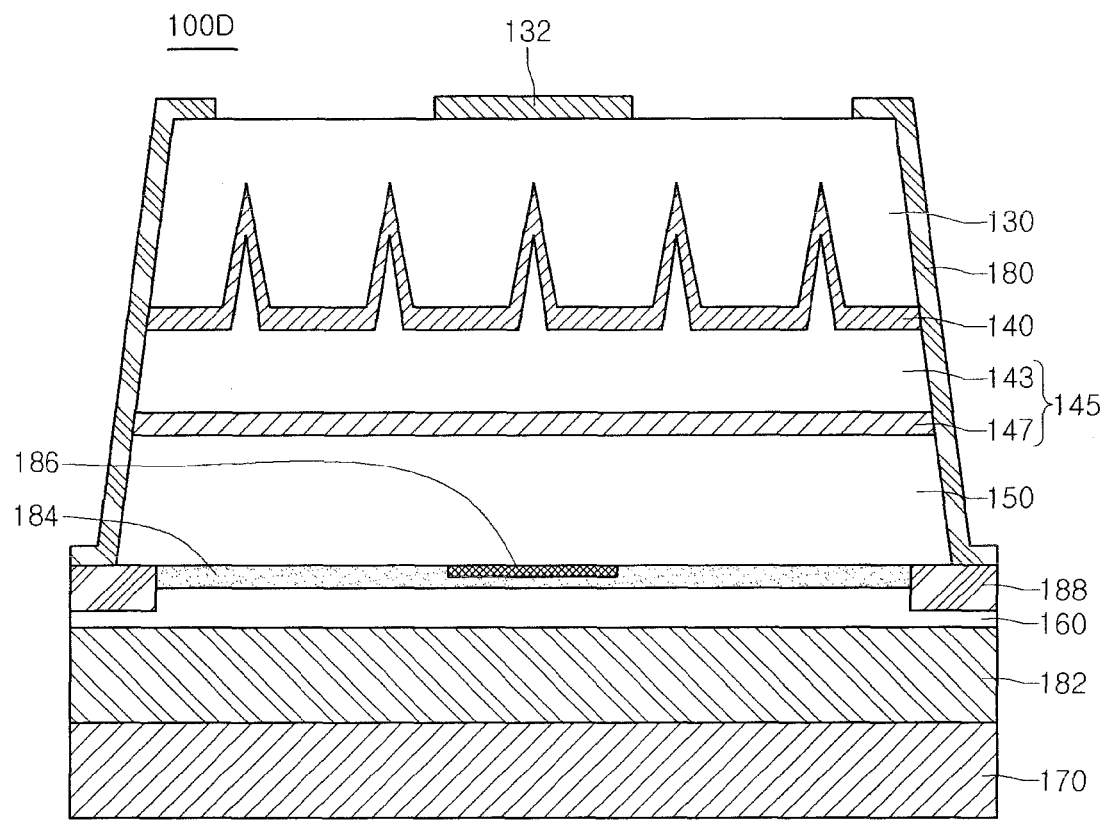
FIG. 8 is a cross-sectional view of a light emitting device according to another modified embodiment.

FIG. 8 is a cross-sectional view of a light emitting device 100D according to another modified embodiment.

Referring to FIG. 8, in the light emitting device 100D with a vertical electrode structure, a passivation layer 180 may be formed at least the lateral surface region of a first conductive type semiconductor layer 130, an active layer 140, and a second conductive type semiconductor layer 150. Also, between the second conductive type semiconductor layer 150 and a conductive support member 170, an adhesive layer 182, an ohmic cntact layer 184, a current blocking layer (CBL) 185, and a protective member 188 are formed, together with a reflective layer 160.

The adhesive layer 182 may be formed on the conductive support member 170. For example, the adhesive layer 182 may include at least one of Ti, Au, Sn, Ni, Cr, Ga, In, Bi, Cu, Ag, and Ta. In addition, the adhesive layer 182 may include a plurality of layers having different materials.

The reflective layer 160 may be formed on the adhesive layer 182. Because the reflective layer 160 was described in the above, the detailed description will be omitted.

The ohmic contact layer 184 may be formed on the reflective layer 160. The ohmic contact layer 184 may form an ohmic contact with the second conductive type semiconductor layer 150.

For example, the ohmic contact layer 184 may include at least one of ITO (indium tin oxide), Ni, Pt, Ir, Rh, and Ag, but is not limited thereto.

The protective layer 188 may be formed at the peripheral region of the upper surface of the reflective layer 160 and the outer peripheral region of the ohmic contact layer 184. The protective layer 188 prevents the electrical short between the second conductive type semiconductor layer 150 and the conductive support members 170.

The protective layer 188 may include transparent materials in order to minimize the loss in light. For example, the protective layer 188 may include at least one of $SiO_2$, $Si_xO_y$, $Si_3N_4$, $Si_xN_y$, $SiO_xN_y$, $Al_2O_3$, $TiO_2$, ITO, AZO (aluminum zinc oxide), and ZnO. On the other hand, the protective layer 188 may include a conductive material, for example, at least one of Ti, Ni, Pt, Pd, Rh, Ir, and W. The materials of the protective layer 188 are not limited thereto.

The current blocking layer 186 may be formed between the ohmic layer 184 and the second conductive type semiconductor layer 150 such that the current blocking layer 186 partially overlaps the third electrode 132 in a vertical direction. Therefore, the current blocking layer 186 can prevent current from being concentrated along the shortest path so that the current is distributed into the entire region of the light emitting device 100D, thereby contributing to the enhancement in the light emitting efficiency.

The current blocking layer 186 may be formed of a material forming a Shottkey contact with the second conductive type semiconductor layer 150, that is, a material having an electrical insulation property or a material having an electrical conductivity lower than the ohmic layer 184. For example, the current blocking layer 186 may include at least one of ZnO, $SiO_2$, $SiO_x$, $SiO_xN_y$, $Si_3N_4$, $Al_2O_3$, $TiO_x$, Ti, Al, or Cr, but is not limited thereto.

The second conductive type semiconductor layer 150, the anti-current leakage layer 145, the active layer 140, and the first conductive type semiconductor layer 130 are sequentially formed on the ohmic contact layer 184 and the protective layer 188. The passivation layer 180 may be formed on at least a side surface of the second conductive type semiconductor layer 150, the anti-current leakage layer 145, the active layer 140, and the first conductive type semiconductor layer 130. The passivation layer 180 may be formed to electrically insulate the side surface of the second conductive type semiconductor layer 150, the anti-current leakage layer 145, the active layer 140, and the first conductive type semiconductor layer 130 from an outer electrode (not shown), but is not limited thereto.

As shown, one end of the passivation layer 180 may be formed on the upper surface of the first conductive type semiconductor layer 130 and the other end of the passivation layer 180 may be formed on the protective layer 188. However, the passivation layer 180 is not limited thereto.

For example, the passivation layer 180 may include $SiO_2$, $SiO_x$, $SiO_xN_y$, $Si_3N_4$, or $Al_2O_3$ but is not limited thereto.

Figure 9:
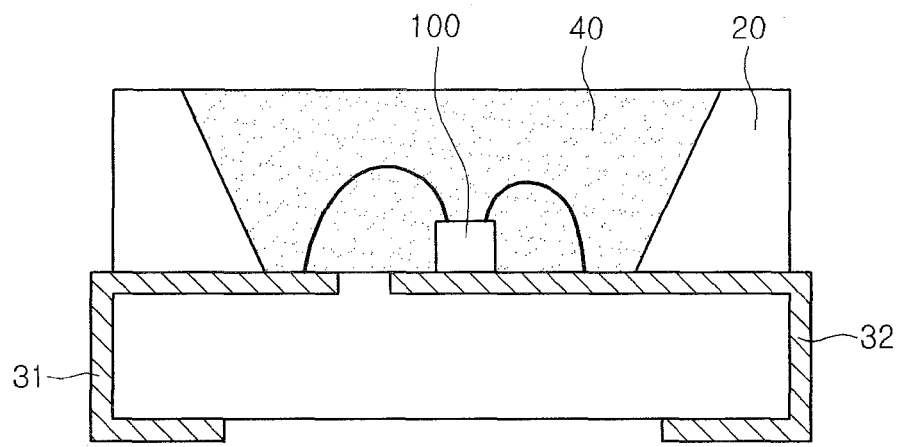
FIG. 9 is a cross-sectional view of a light emitting device package including a light emitting device according to an embodiment.

FIG. 9 is a cross-sectional view of a light emitting device package including the light emitting device 100 according to the embodiment.

Referring to FIG. 9, the light emitting device package according to the embodiment includes a package body 20, first and second lead electrodes 31 and 32 mounted on the package body 20, a light emitting device 100 according to the embodiments, which is mounted on the package body 20 and electrically connected to the first and second lead electrodes 31 and 32, and a molding member 40 enclosing the light emitting device 100.

The package body 20 may be formed including a silicon material, a synthetic resin material, or a metallic material, and may have an inclination surface around the light emitting device 100.

The first lead electrode 31 and the second lead electrode 32 are electrically separated, and supply an electric power to the light emitting device 100. Also, the first and second lead electrodes 31 and 32 may reflect light generated from the light emitting device 100 to thus increase light efficiency, and may emit heat generated from the light emitting device 100 to an outside.

The light emitting device 100 may be mounted on the package body 20 or on the first lead electrode 31 or the second lead electrode 32.

For example, the light emitting device 100 may be electrically connected to the first lead electrode 31 and the second lead electrode 32 by using the wire.

According to the embodiment, the wire is bonded to the first electrode 128 or 128a, or the bonding metal layer 129, 129a, or 129b on the protective member 155. Thus, the light loss by the wire can be minimized, and the damage of the light emitting structure 145 that may be generated when the wire is bonded can be prevented.

The molding member 40 may enclose and protect the light emitting device 100. Also, a fluorescent material may be included in the molding member 40 to change the wavelength of light emitted from the light emitting device 100.

The light emitting device package according to the current embodiment may mount at least one of the light emitting devices according to the foregoing embodiments, but the present invention is not limited thereto. The light emitting device package may include a plurality of light emitting device packages which are arrayed on a substrate. A plurality of optical members, such as a light guide panel, a prism sheet, a diffusion sheet, a fluorescent sheet, and the like may be arranged on a path of light emitted from the light emitting device package. The light emitting device package, substrate and optical members may function as a backlight unit or lighting unit, and a lighting system may include, for example, a backlight unit, a lighting unit, an indicator unit, a lamp, a streetlamp, etc.

Figure 10:
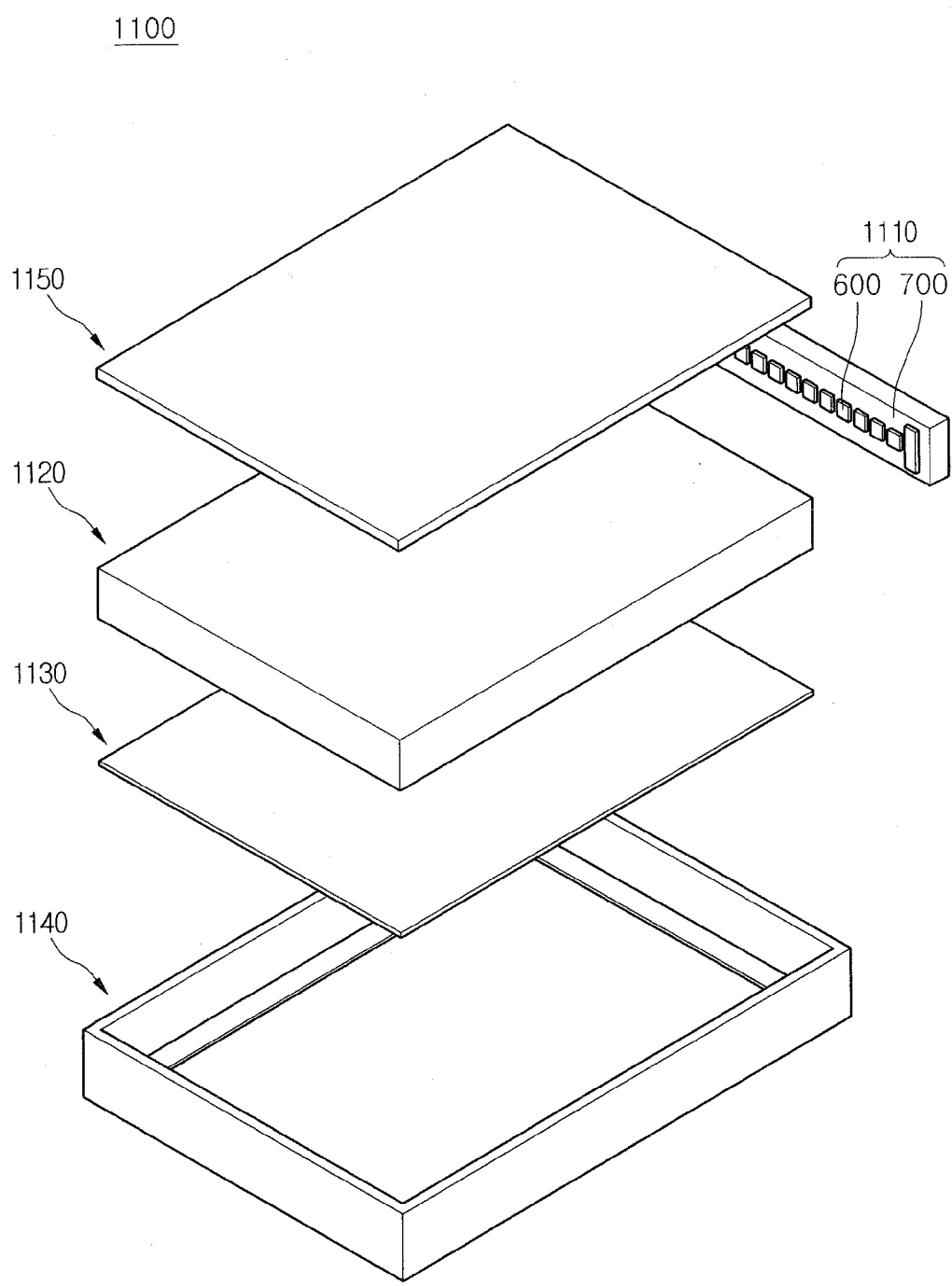
FIG. 10 is a disassembled perspective view of a backlight unit including a light emitting device or a light emitting device package according to an embodiment.

FIG. 10 is a disassembled perspective view of a backlight unit including a light emitting device or a light emitting device package according to an embodiment. The backlight unit 1100 of FIG. 10 is one example of lighting systems, and the present invention is not limited thereto.

Referring to FIG. 10, the backlight unit 1100 may include a bottom cover 1140, a light guide member 1120 disposed in the bottom cover 1140, and a light emitting module 1110 disposed on at least one side surface of the light guide member 1120 or under the light guide member 1120. Also, a reflective sheet 1130 may be disposed under the light guide member 1120.

The bottom cover 1140 may be formed in a box shape a top surface of which is opened such that the light guide member 1120, the light emitting module 1110 and the reflective sheet 1130 can be received. The bottom cover 1140 may be formed of a metal or resin material, but the invention is not limited thereto.

The light emitting module 1110 may include a substrate 700 and a plurality of light emitting device packages 600 mounted on the substrate 700. The plurality of light emitting device packages 600 may provide light to the light guide member 1120. In the light emitting module 1110 according to the current embodiment, it is exemplarily shown that the light emitting device packages 600 are mounted on the substrate 700, but the light emitting devices according to the embodiments may be mounted directly on the substrate 700.

As shown in FIG. 10, the light emitting module 1110 may be disposed on at least one of inner side surfaces of the bottom cover 1140, and thus may provide light to at least one of the side surfaces of the light guide member 1120.

It is also to be understood that the light emitting module 1110 may be disposed under the light guide member 1120 inside the bottom cover 1140 to provide light toward a bottom surface of the light guide member 1120. However, since such a constitution may be modified according to the design of the backlight unit 1100, the invention is not limited thereto.

The light guide member 1120 may be disposed inside the bottom cover 1140. The light guide member 1120 may convert the light provided from the light emitting module to a planar light source and guide the converted plane light source to a display panel (not shown).

The light guide member 1120 may be, for example, a light guide panel (LGP). The LGP may be formed of, for example, one of acryl-series resin such as polymethyl metaacrylate (PMMA), polyethylene terephthlate (PET), poly carbonate (PC), COC, and polyethylene naphthalate resin.

An optical sheet 1150 may be disposed on the light guide member 1120.

The optical sheet 1150 may include, for example, at least one of a diffusion sheet, a light-condensing sheet, a brightness enhancement sheet and a fluorescent sheet. For example, the optical sheet 1150 may be configured by the diffusion sheet, the light-condensing sheet, the brightness enhancement sheet and the fluorescent sheet stacked. In this case, the diffusion sheet 1150 diffuses the light emitted from the light emitting module 1110 uniformly, and the diffused light may be condensed on the display panel (not shown) by the light-condensing sheet. At this time, the light emitted from the light-condensing sheet is a randomly polarized light, and the brightness enhancement sheet may increase the polarization of the light emitted from the light-condensing sheet. The light-condensing sheet may be, for example, a horizontal and/or vertical prism sheet. Also, the brightness enhancement sheet may be, for example, a dual brightness enhancement film. Also, the fluorescent sheet may be a transparent plate or film including a fluorescent material.

The reflective sheet 1130 may be disposed under the light guide member 1120. The reflective sheet 1130 may reflect light emitted from the bottom surface of the light guide member 1120 toward a light emitting surface of the light guide member 1120.

The reflective sheet 1130 may be formed of resin material having good reflectivity, for example, PET, PC, PVC resins, or the like, but the invention is not limited thereto.

Figure 11:
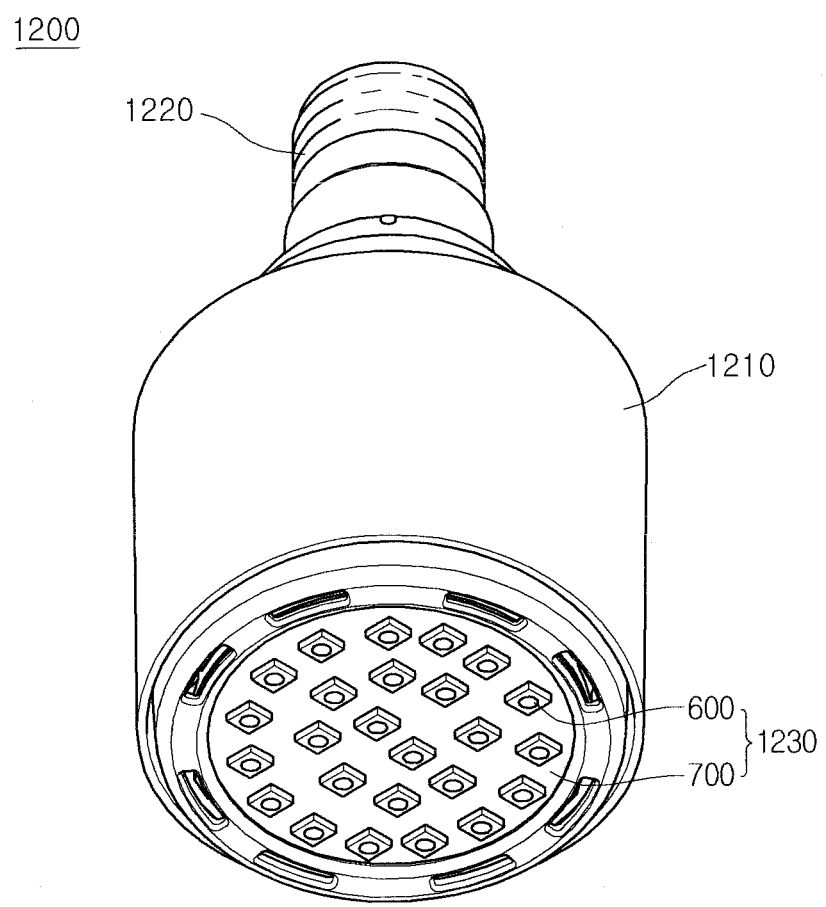
FIG. 11 is a perspective view of a lighting unit including a light emitting device or a light emitting device package according to an embodiment.

FIG. 11 is a perspective view of a lighting unit including a light emitting device or a light emitting device package according to an embodiment. The lighting unit 1200 of FIG. 11 is an example of lighting systems and the invention is not limited thereto.

Referring to FIG. 11, the lighting unit 1200 may include a case body 1210, a light emitting module 1230 installed in the case body 1210, and a connection terminal installed in the case body 1210 to be supplied with an electric power from an external power source.

The case body 1210 may be preferably formed of a material having good heat shielding characteristic, for example, a metal material or a resin material.

The light emitting module 1230 may include a substrate 700, and a light emitting device package 600 mounted on the substrate 700. In the light emitting module 1230 according to the current embodiment, it is exemplarily shown that the light emitting device packages 600 are mounted on the substrate 700, but the light emitting devices according to the embodiments may be mounted directly on the substrate 700.

The substrate 700 may be an insulator substrate on which a circuit pattern is printed, and may include, for example, a general printed circuit board (PCB), a metal core PCB, a flexible PCB, a ceramic PCB, etc.

Also, the substrate 700 may be formed of a material to efficiently reflect light, and a surface thereof may be formed in a color capable of efficiently reflecting light, for example, a white color, silver color, or the like.

At least one light emitting device package 600 may be mounted on the substrate 700. Each of the light emitting device packages 600 may include at least one light emitting diode (LED). The light emitting diode may include a color LED emitting red, green, blue or white light, and a UV LED emitting ultraviolet (UV).

The light emitting module 1230 may have a combination of several LEDs so as to obtain desired color and luminance. For example, the light emitting module 1230 may have a combination of a white LED, a red LED, and a green LED so as to obtain a high color rendering index (CRI). A fluorescent sheet may be further disposed on a path of light emitted from the light emitting module 1230. The fluorescent sheet converts the wavelength of the light emitted from the light emitting module. For example, when the light emitted from the light emitting module 1230 has a blue wavelength band, the fluorescent sheet may include a yellow fluorescent material, so that the light, which is emitted from the light emitting module 1230 and passes through the fluorescent sheet, finally appears as white light.

The connection terminal 1220 may be electrically connected to the light emitting module 1230 to supply an electric power to the light emitting module 1230. As shown in FIG. 11, the connection terminal 1220 may be screwed and coupled to an external power, but the invention is not limited thereto. For example, the connection terminal 1220 may be made in a pin type and inserted into an external power, or may be connected to the external power through a power line.

As described above, the lighting system may include at least one of a light guide member, a diffusion sheet, a light-condensing sheet, a brightness enhancement sheet and a fluorescent sheet on a traveling path of light to obtain a desired optical effect.

As described above, since the lighting system according to this embodiment includes the light emitting device or light emitting device package having the enhanced light emitting efficiency and the enhanced reliability, the lighting system can show superior characteristics.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a first conductive type semiconductor layer including a plurality of grooves;
    an active layer formed over an upper surface of the first conductive type semiconductor layer and along the grooves;
    at least one anti-current leakage layer having a substantially flat upper surface over the active layer; and
    a second conductive type semiconductor layer over the anti-current leakage layer,
    wherein the at least one anti-current leakage layer includes a first anti-current leakage layer and a second anti-current leakage layer over the first anti-current leakage layer, wherein the first anti-current leakage layer includes $In_xAl_yGa_{1-x-y}N$ ($0<x\leq0.03$, $0<y<1$, $0<x+y<1$), and wherein the second anti-current leakage layer has a superlattice structure in which a stack structure of an AlGaN layer and a GaN layer is repeatedly stacked.

2. The light emitting device of claim 1, wherein the grooves have one of a substantially V-shape elongated in one direction, a conical shape, and or a polygonal pyramid shape.

3. The light emitting device of claim 1, wherein at least one of the first or second anti-current leakage layers has a bandgap greater than a bandgap of the active layer.

4. The light emitting device of claim 1, wherein the first conductive type semiconductor layer has a thickness in a range of about 1 μm to about 5 μm, and wherein the second conductive type semiconductor layer has a thickness in a range of about 1 μm to about 1.5 μm.

5. The light emitting device of claim 1, wherein the first conductive type semiconductor layer includes Zn.

6. A light emitting device, comprising:
    a first conductive type semiconductor layer including a plurality of grooves;
    an active layer formed over an upper surface of the first conductive type semiconductor layer and along the grooves;
    at least one anti-current leakage layer having a substantially flat upper surface over the active layer;
    a second conductive type semiconductor layer over the anti-current leakage layer;
    a groove forming layer under the first conductive type semiconductor layer; and
    an undoped semiconductor layer under the groove forming layer, wherein the groove forming layer includes a plurality of second grooves.

7. The light emitting device of claim 6, wherein the groove forming layer is made of a material identical to a material of the undoped semiconductor layer.

8. The light emitting device of claim 6, further comprising a superlattice structure layer, in which an InGaN layer and a GaN layer are repeatedly stacked, between the groove forming layer and the first conductive type semiconductor layer.

9. The light emitting device of claim 6, wherein the groove forming layer has a thickness in a range of about 0.5 μm to about 5 μm.

10. The light emitting device of claim 6, wherein an upper portion of one or more of the second grooves has a width of about 0.5 μm to about 1.5 μm, and wherein one or more of the second grooves have a depth of about 0.3 μm to about 0.7 μm.

* * * * *